United States Patent [19]

Deeg

[11] Patent Number: 5,194,703
[45] Date of Patent: Mar. 16, 1993

[54] PUSH-BUTTON ARRANGEMENT

[75] Inventor: Reinhard Deeg, Keltern, Fed. Rep. of Germany

[73] Assignee: Alcatel N.V., Amsterdam, Netherlands

[21] Appl. No.: 628,689

[22] Filed: Dec. 17, 1990

[30] Foreign Application Priority Data

Dec. 18, 1989 [DE] Fed. Rep. of Germany ....... 3941712

[51] Int. Cl.$^5$ .............................................. H01H 9/22
[52] U.S. Cl. .................................. 200/5 A; 200/292; 200/513
[58] Field of Search ............. 200/5 A, 5 R, 292, 291, 200/512, 513, 530; 361/400, 405, 397, 399

[56] References Cited

U.S. PATENT DOCUMENTS 5,053,592  10/1991  Zuercher ............................. 200/553

FOREIGN PATENT DOCUMENTS 0005175  11/1979  European Pat. Off. .
0078036   5/1983  European Pat. Off. .
3343321   6/1985  Fed. Rep. of Germany .
8800951   4/1988  Fed. Rep. of Germany .
2454684  11/1980  France .
2046519  11/1980  United Kingdom .
2201038   8/1988  United Kingdom .

Primary Examiner—A. D. Pellinen
Assistant Examiner—Michael A. Friedhofer
Attorney, Agent, or Firm—Spencer, Frank & Schneider

[57] ABSTRACT

Push-button device includes a plurality of movably disposed keys and an elastic switching pad having a plurality of domes. Each dome is disposed adjacent to and is engagable by one of the plurality of keys and a dome contact disposed on each dome. A conductor foil having a plurality of contacts is provided, each conductor foil contact being arranged for contacting one of the dome contacts when one of the keys is moved. A printed circuit board having upper and lower faces is arranged near the contact foil. A spacer member disposed between the upper face of the printed circuit board and the conductor foil defines an electrical component receiving space, and there is a plurality of electrical components located on the upper face in the electrical component receiving space.

7 Claims, 2 Drawing Sheets

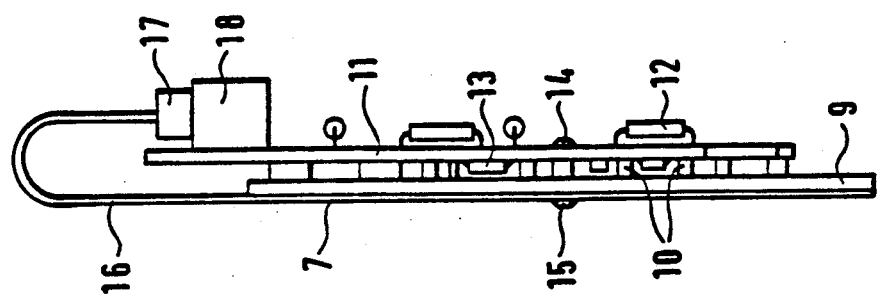
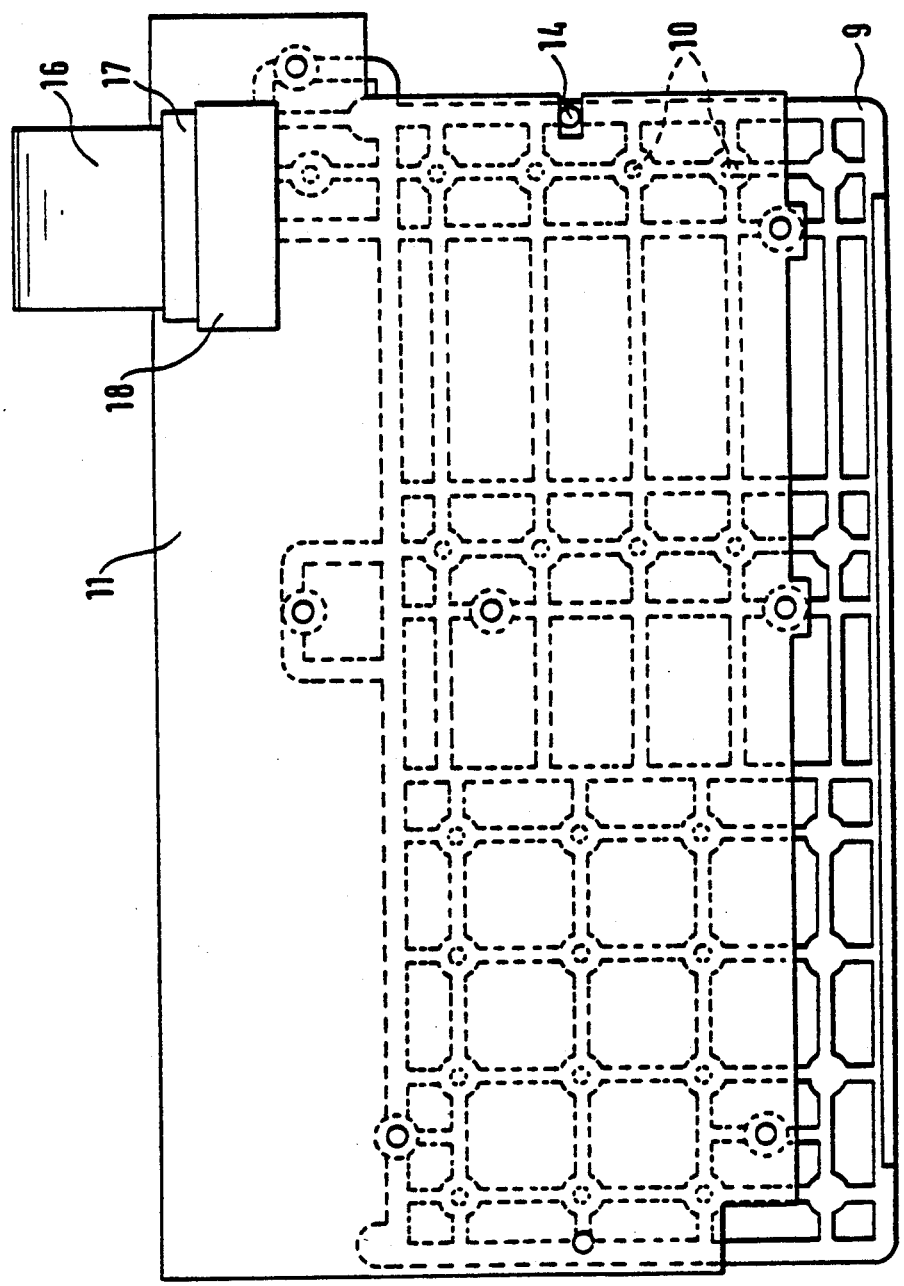

PUSH-BUTTON ARRANGEMENT

CROSS REFERENCE TO RELATED APPLICATION

This application claims the priority of application Ser. No. P 39 41 712.3, filed Dec. 18, 1989, in the Federal Republic of Germany, the subject matter of which is incorporated herein by reference.

BACKGROUND OF THE INVENTION

The invention relates to a push button arrangement including a printed circuit board and having keys which engage the domes of an elastic switching pad. Each dome has a switching contact for establishing an electrical connection when a key is moved and engages one of the domes.

Such an arrangement is disclosed, for example, in DE No. 3,343,321.A1 which relates to a dial pad for telephones. The keys are guided in the housing of the dial pad and, when depressed, act on the domes of an elastic switching pad containing contacts which come in contact with the contacts of a contact plate. The contact plate may be a printed circuit board which, on its side facing the switching pad (top side), is provided, in addition to the contacts, also with the connecting conductor paths. As customary, necessary electrical components can be arranged on the underside of the printed circuit board. Since the area is relatively small, it may happen, particularly in connection with comfortable telephones, that only part of the electrical components can be accommodated on the printed circuit board of the dial pad. The other part must be fastened somewhere else in the apparatus.

SUMMARY OF THE INVENTION

It is an object of the invention to increase the capacity of the key arrangement for electrical components. This is accomplished by the features of a preferred embodiment of the invention in which a push-button device includes a plurality of movably disposed keys and an elastic switching pad having a plurality of domes. Each dome is disposed adjacent to and is engagable by one of the plurality of keys and a dome contact disposed on each dome. A conductor foil having a plurality of contacts is provided, each conductor foil contact being arranged for contacting one of the dome contacts when one of the keys is moved. A printed circuit board having upper and lower faces is arranged near the contact foil. A spacer member disposed between the upper face of the printed circuit board and the conductor foil defines an electrical component receiving space, and there is a plurality of electrical components located on the upper face in the electrical component receiving space. Modifications are described below. The advantage of this structure is not only the significant increase in the number of components that can be fastened to the printed circuit board but also that the arrangement can be assembled, from the printed circuit board to the switching pad, without special fastening means and when assembled constitutes a complete, testable, economical component group. Further advantages will become evident in the description that follows.

BRIEF DESCRIPTION OF THE DRAWINGS

The invention will be described with reference to one embodiment thereof that is illustrated in the associated drawing figures, in which:

FIG. 2 is a view of the push-button arrangement showing the key structure of FIG. 1, seen from the side of the printed circuit board, without switching pad, keys and housing; and FIG. 3, is a side view of the arrangement of FIG. 2.

DETAILED DESCRIPTION OF THE PREFERRED EMBODIMENT

Figure 1:
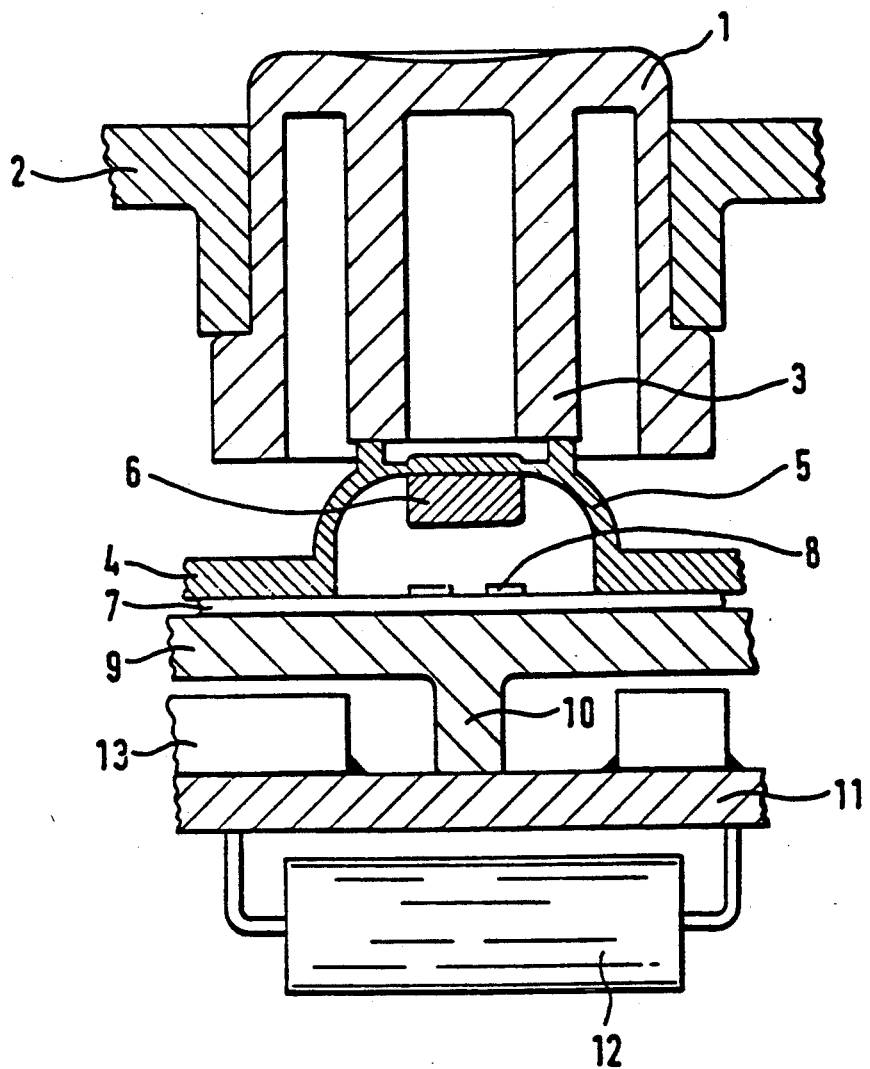
FIG. 1 is a longitudinal sectional view of the push-button of a push-button arrangement according to a preferred embodiment of the invention.

FIG. 1 is a sectional view of the configuration of a push button of the arrangement shown in FIGS. 2 and 3. Push button 1 is guided in a housing 2 and is provided with a hollow cylinder 3 in its interior. The edge of this hollow cylinder 3 is seated on the dome 5 of an elastic switching pad 4. In the interior of dome 5, a contact 6 is attached to its cupola. Such switching pads are customary in the trade.

If push button 1 is depressed, dome 5 is pushed in, thus bringing contact 6 in contact with contacts 8 of a conductor foil 7 disposed underneath switching pad 4. In addition, conductor foil 7 is disposed on a spacer frame 9 which establishes the spacing from a printed circuit board 11 which is equipped on both sides with electrical components 12 and 13.

Spacer frame 9 is given a lattice shape, with the points of intersection of the lattice rods, hereinafter called lattice nodes, each lying underneath a push button. The height of the lattice rods is less than the distance between conductor foil 7 and printed circuit board 11. The missing part is bridged in each case by spacer pins 10 which are seated in the lattice nodes of spacer frame 9. The lattice nodes may be provided with cylindrical thickened portions. For an intended push-button arrangement as shown in FIG. 2, the entire spacer frame 9 is advisably molded of one piece of plastic together with the spacer pins 10 at the lattice nodes, as well as further detent pins 14, which penetrate printed circuit board 11 and engage behind an opening edge. On the other side of spacer frame 9, there are also molded-on detent pins 15 with the aid of which the conductor foil 7 is fixed (FIG. 3).

As is evident from FIGS. 1 and 3, printed circuit board 11 may advantageously be fully equipped on both sides with components 12 and 13. The utilization of the second, interior upper face is made possible by spacer frame 9. In the example shown in FIG. 1, a printed circuit board is employed that is coated on one side, with the coated side, that is, the side bearing the conductor paths, facing the spacer frame. This side is equipped with surface-mounted components (SMC) 13, the other side with conventional components 12. However, other printed circuit boards having two or more layers and other types of equipment may also be employed. If larger, conventional components 12 are to be attached also to the upper side, the layout of the printed circuit board must be designed so that these components are seated in the spaces formed by the lattice of spacer frame 9.

In the illustration of FIGS. 2 and 3, switching pad 4 and push buttons 1 as well as housing 2 are not shown. This constitutes the switching component of the push-button arrangement. The terminals of conductor foil 7 are brought by way of a tab 16 to a plug-in connector 17 which is plugged into a contact strip 18. On printed circuit board 11. This component group may be prefabricated, tested and stored. In FIG. 2, the components on printed circuit board 11 have also been omitted for the sake of clarity. Instead, the portion of space frame 9 that is not visible is also shown in dashed lines to more clearly illustrate the lattice structure.

By arranging the space pins 10 in the lattice nodes 10 underneath the push buttons, reliable contact between contacts 6 and 8 is ensured. Spacer frame 9 is supported by way of the spacer pins 10 on printed-circuit board 11. Since the lattice rods of the spacer frame are elastic and the outer circumferences of push buttons 1, when actuated, make contact in the form of a ring, there occurs a slight subsequent movement which is of advantage from a circuit technology point of view.

It will be understood that the above description of the present invention is susceptible to various modifications, changes and adaptations, and the same are intended to be comprehended within the meaning and range of equivalents of the appended claims.

What is claimed is:

1. A push-button device comprising:
   a plurality of keys;
   an elastic switching pad having a plurality of domes, each dome being arranged adjacent to and being engageable by a respective one of said plurality of keys;
   a dome contact disposed of each dome;
   a conductor foil having a plurality of contacts arranged for being contacted by one of said dome contacts when one of said keys engages a respective dome;
   a printed circuit board having opposite faces one of which is arranged near but spaced from said conductor foil;
   a spacer means disposed between said one face of said printed circuit board and said conductor foil; and
   electrical components disposed on at least said one face of said printed circuit board;
   wherein said spacer means comprises a lattice having a plurality of lattice nodes, each said lattice node being arranged adjacent one of the conductor foil contacts, and a spacer pin extending toward said one face is disposed on each said node.

2. A push-button device as defined in claim 1, wherein said electrical components are disposed on each of said opposite faces of said printed circuit board.

3. A push-button device as defined in claim 1, wherein said printed circuit board and said conductor foil each comprises means defining openings therein, said lattice has opposite sides, and detent pins extending through and engaging with said openings are disposed on each said side.

4. A push-button device comprising:
   a plurality of keys;
   an elastic switching pad having a plurality of domes, each dome being arranged adjacent to and being engageable by a respective one of said plurality of keys;
   a dome contact disposed on each dome;
   a conductor foil having a plurality of contacts arranged for being contacted by one of said dome contacts when one of said keys engages a respective dome;
   a printed circuit board having opposite faces one of which is arranged near but spaced from said conductor foil;
   a spacer means disposed between said one face of said printed circuit board and said conductor foil; and
   electrical components disposed on at least said one face of said printed circuit board;
   wherein said spacer means comprises a lattice and said electrical components extend therethrough.

5. A push-button device as defined in claim 4, wherein said electrical components are disposed on each of said opposite faces of said printed circuit board.

6. A push-button device as defined in claim 4, wherein said printed circuit board and said conductor foil each comprises means defining openings therein, said lattice has opposite sides, and detent pins extending through and engaging with said openings are disposed on each said side.

7. A push-button device comprising:
   a plurality of keys;
   an elastic switching pad having a plurality of domes, each dome being arranged adjacent to and being engageable by a respective one of said plurality of keys;
   a dome contact disposed on each dome;
   a conductor foil having a plurality of contacts arranged for being contacted by one of said dome contacts when one of said keys engages a respective dome;
   a printed circuit board having opposite faces one of which is arranged near but spaced from said conductor foil;
   a spacer means disposed between said one face of said printed circuit board and said conductor foil; and
   electrical components disposed on at least said one face of said printed circuit board;
   wherein said electrical components are disposed on each of said opposite faces of said printed circuit board;
   wherein said spacer means comprises a lattice having a plurality of lattice nodes, each said lattice node being arranged adjacent one of the conductor foil contacts, and a spacer pin extending toward said one face is disposed on each said node;
   wherein said printed circuit board and said conductor foil each comprises means defining openings therein, said lattice has opposite sides, and detent pins extending through and engaging with said openings are disposed on each said side; and
   wherein said spacer means comprises a lattice and said electrical components extend therethrough.

* * * * *